United States Patent
Golov

(10) Patent No.: US 10,846,955 B2
(45) Date of Patent: Nov. 24, 2020

(54) BLACK BOX DATA RECORDER FOR AUTONOMOUS DRIVING VEHICLE

(71) Applicant: Micron Technology, Inc., Boise, ID (US)

(72) Inventor: Gil Golov, Backnang (DE)

(73) Assignee: Micron Technology, Inc., Boise, ID (US)

( * ) Notice: Subject to any disclaimer, the term of this patent is extended or adjusted under 35 U.S.C. 154(b) by 58 days.

(21) Appl. No.: 15/923,820

(22) Filed: Mar. 16, 2018

(65) Prior Publication Data
US 2019/0287319 A1    Sep. 19, 2019

(51) Int. Cl.
*G07C 5/08* (2006.01)
*H03M 7/30* (2006.01)

(52) U.S. Cl.
CPC ............. *G07C 5/085* (2013.01); *H03M 7/30* (2013.01); *H03M 7/70* (2013.01)

(58) Field of Classification Search
None
See application file for complete search history.

(56) References Cited

U.S. PATENT DOCUMENTS

| | | |
|---|---|---|
| 5,546,579 A | 8/1996 | Josten et al. |
| 5,815,093 A | 9/1998 | Kikinis |
| 5,936,315 A * | 8/1999 | Lais ................. G07C 5/085 307/10.1 |
| 5,956,703 A | 9/1999 | Turner et al. |
| 6,345,219 B1 | 2/2002 | Klemens |
| 6,629,030 B2 | 9/2003 | Klausner et al. |
| 7,190,882 B2 | 3/2007 | Gammenthaler |
| 7,383,389 B1 | 6/2008 | Bumbulis |
| 7,653,778 B2 | 1/2010 | Merry, Jr. et al. |
| 7,711,461 B2 | 5/2010 | Yokogawa |

(Continued)

FOREIGN PATENT DOCUMENTS

| | | |
|---|---|---|
| JP | 2000-128030 | 5/2000 |
| JP | 2002293271 A | 10/2002 |

(Continued)

OTHER PUBLICATIONS

International Search Report and Written Opinion, PCT/US2019/019562, dated Jun. 3, 2019.

(Continued)

*Primary Examiner* — David P. Merlino
(74) *Attorney, Agent, or Firm* — Greenberg Traurig

(57) ABSTRACT

An improved black box data recorder for use with autonomous driving vehicles (AVD). In one embodiment, two cyclic buffers are provided to record vehicle sensors data. A first cyclic buffer records raw vehicle sensor data on a volatile memory, while a second cyclic buffer records the same vehicle sensor data, as compressed data, on a non-volatile memory. In a case of a collision or near collision, in one embodiment the buffers are flushed into a non-volatile (NV) storage for retrieval. As long as there is no power interruption, the raw vehicle sensor data will be accessible from the NV storage. If a power interruption occurs, the raw vehicle sensor data held in the volatile memory of the first cyclic buffer will be lost and only the compressed form of the vehicle sensor data from the NV second cyclic buffer will survive and be accessible.

17 Claims, 3 Drawing Sheets

(56) References Cited

U.S. PATENT DOCUMENTS

| | | |
|---|---|---|
| 8,010,248 B2 | 8/2011 | Sano |
| 8,060,718 B2 | 11/2011 | Freitas et al. |
| 8,090,495 B2 | 1/2012 | Fink et al. |
| 8,122,185 B2 | 2/2012 | Merry, Jr. et al. |
| 8,160,764 B2 | 4/2012 | Choi et al. |
| 8,312,207 B2 | 11/2012 | Merry, Jr. et al. |
| 8,321,084 B2 | 11/2012 | Yamashita et al. |
| 8,452,481 B2 | 5/2013 | Ishiko et al. |
| 8,527,778 B2 | 9/2013 | Kim |
| 8,531,793 B2 | 9/2013 | Bandic et al. |
| 8,601,202 B1 | 12/2013 | Melcher et al. |
| 8,688,915 B2 | 4/2014 | Daly et al. |
| 8,725,312 B2 | 5/2014 | Mori et al. |
| 8,793,431 B2 | 7/2014 | Bandic et al. |
| 8,930,625 B2 | 1/2015 | Daly et al. |
| 8,930,668 B2 | 1/2015 | Engle et al. |
| 8,959,280 B2 | 2/2015 | Yu et al. |
| 8,990,874 B2 | 3/2015 | Huang |
| 9,298,603 B2 | 3/2016 | Schuette |
| 9,365,162 B2 | 6/2016 | Nix |
| 9,802,541 B2 | 10/2017 | Nix |
| 10,102,696 B2 | 10/2018 | Iwaasa |
| 10,214,213 B2 | 2/2019 | Kojima |
| 10,229,547 B2 | 3/2019 | Isozaki et al. |
| 10,248,627 B2 | 4/2019 | Yang et al. |
| 10,308,181 B2 | 6/2019 | Nix |
| 10,318,495 B2 | 6/2019 | Talagala et al. |
| 10,365,835 B2 | 7/2019 | Monteleone et al. |
| 10,521,976 B2 | 12/2019 | Shin et al. |
| 2002/0107619 A1* | 8/2002 | Klausner ............ G07C 5/085 701/32.2 |
| 2002/0131768 A1 | 9/2002 | Gammenthaler |
| 2004/0263647 A1* | 12/2004 | Yamaguchi ............ G07C 5/085 348/240.2 |
| 2006/0261931 A1 | 11/2006 | Cheng |
| 2007/0132773 A1* | 6/2007 | Plante ................ G07C 5/0891 345/564 |
| 2007/0150644 A1 | 6/2007 | Pinto et al. |
| 2007/0208904 A1 | 9/2007 | Hsieh et al. |
| 2007/0260811 A1 | 11/2007 | Merry, Jr. et al. |
| 2007/0294490 A1 | 12/2007 | Freitas et al. |
| 2008/0208533 A1* | 8/2008 | Yokogawa .......... G06F 11/0739 702/183 |
| 2008/0221751 A1* | 9/2008 | Fink .................... G01R 31/007 701/33.4 |
| 2008/0255723 A1* | 10/2008 | Sano .................... G07C 5/085 701/33.4 |
| 2009/0105902 A1 | 4/2009 | Choi et al. |
| 2009/0240392 A1* | 9/2009 | Yamashita ............ H03M 7/46 701/31.4 |
| 2010/0030540 A1 | 2/2010 | Choi et al. |
| 2010/0223423 A1 | 9/2010 | Sinclair et al. |
| 2010/0250061 A1* | 9/2010 | Toyofuku .............. G07C 5/085 701/33.4 |
| 2010/0332072 A1* | 12/2010 | Ishiko ................ B60T 17/221 701/29.5 |
| 2011/0087893 A1 | 4/2011 | Kim |
| 2011/0131364 A1 | 6/2011 | George Gordon |
| 2012/0014013 A1 | 1/2012 | Bandic et al. |
| 2012/0198335 A1 | 8/2012 | Huang |
| 2012/0210021 A1 | 8/2012 | Flynn et al. |
| 2012/0254266 A1 | 10/2012 | Printezis et al. |
| 2012/0254267 A1 | 10/2012 | Printezis et al. |
| 2012/0284587 A1 | 11/2012 | Yu et al. |
| 2013/0036282 A1 | 2/2013 | Kawachiya et al. |
| 2013/0041522 A1* | 2/2013 | Mori .................... G07C 5/0808 701/1 |
| 2013/0124787 A1 | 5/2013 | Schuette |
| 2013/0151779 A1 | 6/2013 | Daly et al. |
| 2013/0246703 A1 | 9/2013 | Bandic et al. |
| 2014/0089264 A1 | 3/2014 | Talagala et al. |
| 2014/0136809 A1 | 5/2014 | Engle et al. |
| 2014/0320655 A1 | 10/2014 | Kim |
| 2014/0320659 A1* | 10/2014 | Kaneyoshi ............ H04N 5/77 348/148 |
| 2015/0347038 A1 | 12/2015 | Monteleone et al. |
| 2017/0021835 A1* | 1/2017 | Kojima ................ G07C 5/02 |
| 2017/0031906 A1 | 2/2017 | Yang et al. |
| 2017/0148237 A1* | 5/2017 | Iwaasa ............... B60W 50/08 |
| 2017/0278320 A1* | 9/2017 | Isozaki ................ G07C 5/008 |
| 2018/0009330 A1 | 1/2018 | Ricci |
| 2018/0027680 A1 | 1/2018 | Kumar et al. |
| 2019/0080526 A1* | 3/2019 | Shin .................... G07C 5/008 |
| 2019/0163387 A1* | 5/2019 | Jin ...................... G06F 3/0679 |
| 2019/0171389 A1 | 6/2019 | Muthiah et al. |
| 2019/0197799 A1* | 6/2019 | Zwissler ............. B60W 40/10 |
| 2019/0299860 A1 | 10/2019 | Nix |
| 2019/0302766 A1 | 10/2019 | Mondello et al. |
| 2019/0354838 A1 | 11/2019 | Zhang et al. |
| 2019/0371087 A1 | 12/2019 | Shin et al. |
| 2019/0385383 A1 | 12/2019 | Sato |
| 2020/0174677 A1 | 6/2020 | Golov |

FOREIGN PATENT DOCUMENTS

| | | |
|---|---|---|
| JP | 2006-127206 | 5/2006 |
| JP | 2007-280407 | 10/2007 |
| KR | 10-2007-0074388 | 7/2007 |
| KR | 20100057253 A | 5/2010 |
| KR | 10-1810539 | 12/2017 |
| WO | 2008007878 A1 | 1/2018 |
| WO | 2019016114 A1 | 1/2019 |

OTHER PUBLICATIONS

Bin Yang, Ming Liang, Raquel Urtasun, "HDNET: Exploiting HD Maps for 3D Object Detection", Proceedings of the 2nd Conference on Robot Learning, PMLR 87:146-155, 2018.

Harsha Vardhan, "HD Maps: New age maps powering autonomous vehicles", https://www.geospatialworld.net/article/hd-maps-autonomous-vehicles/, Sep. 22, 2017.

International Search Report and Written Opinion, PCT/US2019/019651, dated Jun. 7, 2019.

International Search Report and Written Opinion, PCT/US2020/015877, dated May 27, 2020.

\* cited by examiner

BLACK BOX DATA RECORDER FOR AUTONOMOUS DRIVING VEHICLE

FIELD OF THE TECHNOLOGY

At least some embodiments disclosed herein relate to autonomous vehicle technology and more particularly, but not limited to, black box data recorders for use in autonomous vehicles.

BACKGROUND

Autonomous driving vehicles (ADV) typically include many sensors to assist in the autonomous/driverless vehicle. In the case of an accident, collision, or near collision involving the vehicle, there may be a benefit from reviewing the sensor data recorded just prior to and/or during the accident to assist in potentially determining the cause of the accident, and/or whether there may have been a vehicle failure.

In the event of a power loss during the accident, vehicle sensor data stored in a volatile memory may be lost. Conversely, using non-volatile memory to store the vehicle sensor data can be quite expensive. In addition, the sensor data collected from an ADV is most useful when the data is uncompressed. However, uncompressed sensor data can require significant storage.

BRIEF DESCRIPTION OF THE DRAWINGS

The embodiments are illustrated by way of example and are not limited in the figures of the accompanying drawings in which like references indicate similar elements.

DETAILED DESCRIPTION

At least some embodiments disclosed herein provide an improved black box data recorder for use with autonomous driving vehicles (AVD). Automakers typically want to record raw vehicle sensor data of the autonomous vehicle at all times. However, extended recordings of raw data can be viewed as prohibitively expensive. Embodiments described herein provide an improved solution for recording vehicle sensor data generated immediately prior to and possibly during an event (e.g., collision or near collision involving the respective vehicle or vehicle nearby), while also providing a solution for recording the vehicle sensor data in the event of a power loss.

In one embodiment, within a vehicle two cyclic buffers are provided to record vehicle sensors data. A first cyclic buffer records raw vehicle sensor data on a volatile memory, while a second cyclic buffer records the same vehicle sensor data, as compressed data, on a non-volatile memory (NVM). In a case of a collision or near collision, data in both buffers is available for retrieval. The data the both buffers may also be flushed into a non-volatile (NV) storage for retrieval. If a power interruption occurs, the raw vehicle sensor data held in the volatile memory of the first cyclic buffer could be lost and only the compressed form of the vehicle sensor data from the NVM second cyclic buffer will likely survive and be available for retrieval from the second NV buffer or in the NV storage.

Figure 1:
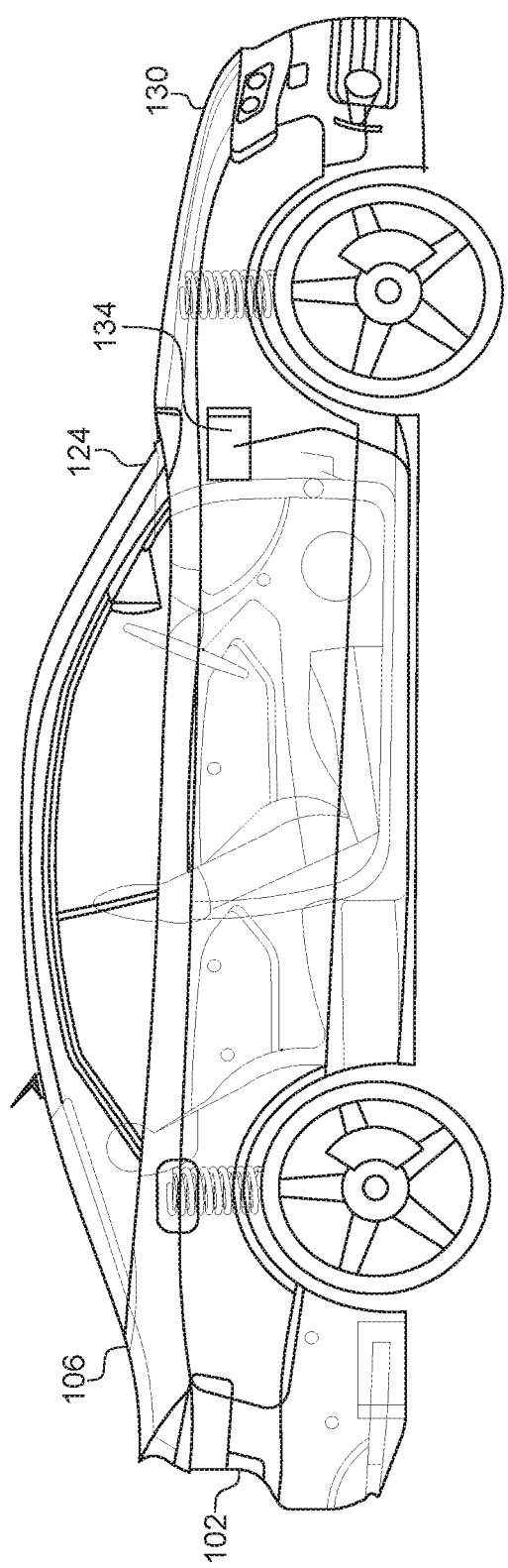
FIG. 1 is a diagram of an autonomous driving vehicle according to one embodiment.

FIG. 1 illustrates one embodiment of an autonomous driving vehicle that is capable of incorporating an improved black box recorder in accordance with one embodiment. The autonomous vehicle 102 may incorporate an on-board diagnostic system, such as a computer, that continuously monitors the status of the vehicle operating systems. Autonomous vehicle 102 may also incorporate a remote link application 106 that links the autonomous vehicle 102 with remote links and data, such as communication systems and global positioning systems (GPS). In one embodiment, the remote link could transfer vehicle sensor data to a black box recorder remote to the autonomous vehicle.

Autonomous vehicle 102 may incorporate different types of vehicle sensors, including a tire pressure monitoring system, inertia sensors, one or more cameras or similar technology such as radar, lidar, laser, sonar, to give a few examples. Vehicle control and operation may be provided by a steering and braking electronic control unit 124 that may also interface with other sensors and the autonomous vehicle operating system, as part of autonomous vehicle operation. The vehicle may also incorporate an electronic control unit for the engine and transmission 130, which may interface with the vehicle access system, the steering and braking electronic control unit 124, and the autonomous vehicle operating system. A controller 134 may be in communication with the on-board sensors and electronic control systems. Controller 134 is also in communication with a black box recorder that records the data of operation and/or vehicle sensor data, as is described in more detail below.

Figure 2:
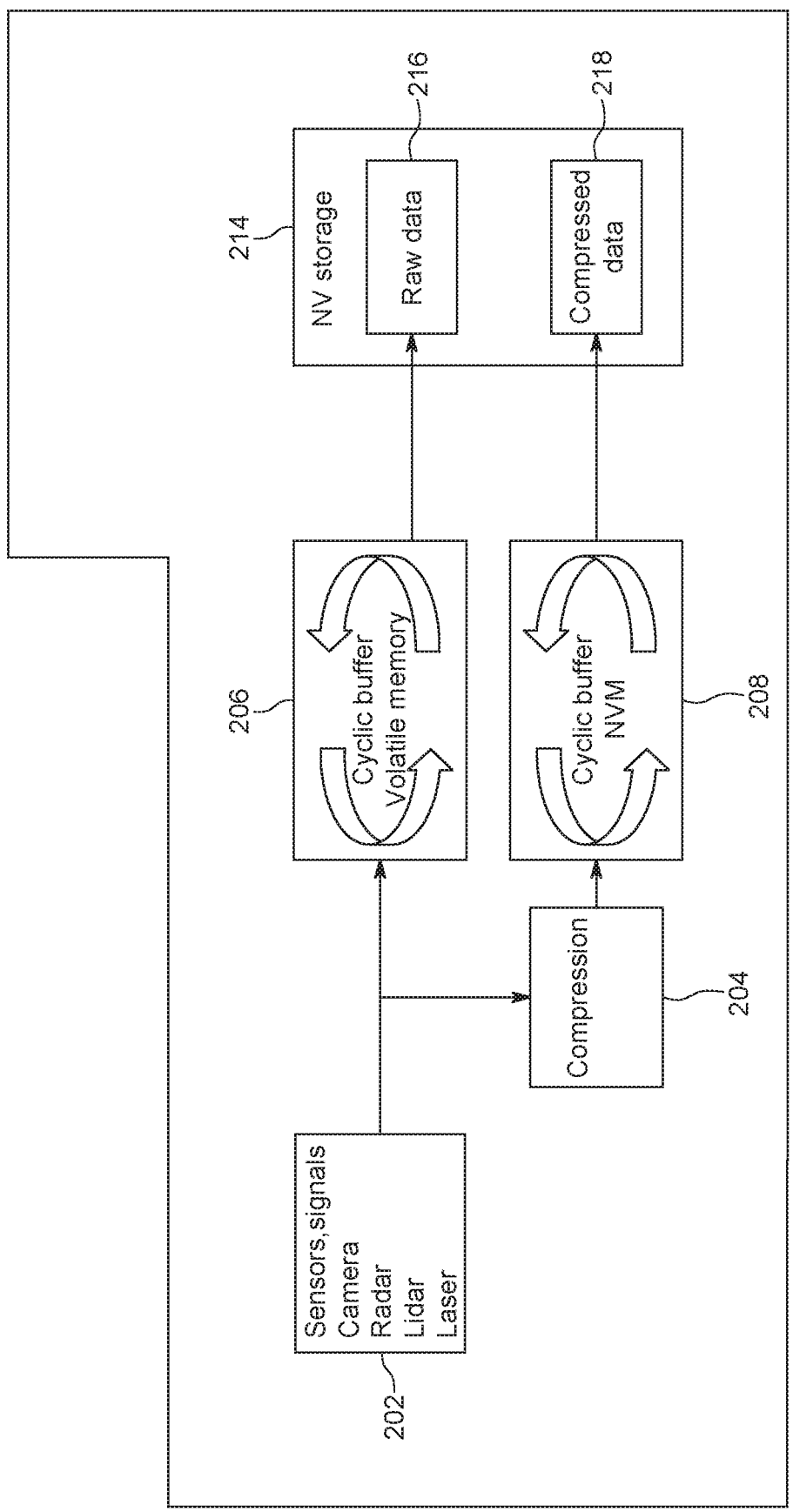
FIG. 2 is a block diagram of an improved black box data recorder for use in autonomous driving vehicles, according to one embodiment

FIG. 2 is a block diagram of an improved black box data recorder for use in autonomous driving vehicles, in accordance with one embodiment described herein. In one embodiment, the black box data recorder receives vehicle sensor data 202 from multiple vehicle sensors. The vehicle sensor data may include, but is not limited to camera data, radar data, lidar data, sonar data, laser measurements, tire pressure monitoring, and vehicle operation system data. The vehicle sensor data as referenced herein may also include vehicle operation data such as GPS data, inertial sensor data, autonomous vehicle computer signals and health status, etc.

The received vehicle sensor data 202 is initially held in a first cyclic buffer 206, as raw vehicle data. In one embodiment, the first cyclic buffer comprises a volatile memory. In one embodiment, the volatile memory of the first cyclic buffer may be implemented as dynamic RAM (DRAM) which requires continual power in order to refresh or maintain the data in the memory.

In parallel, or essentially parallel, to buffering the raw vehicle sensor data in the first cyclic buffer 206, a copy of the raw sensor data is also provided to a data compression unit 204 and is then held in a second cyclic buffer 208, as compressed data. In one embodiment, the second cyclic buffer 208 is a non-volatile memory, which would not lose data in the event of a power cut-off or disruption. In one embodiment, the non-volatile memory is Solid State Drive (SSD) or Flash memory which maintains data even after power is removed from the system. The non-volatile memory may also operate as random access memory. Note, in one embodiment, the data compression unit may further include a data encryption module for encrypting the data to be recorded and buffered in the second cyclic buffer 208.

In one embodiment, the first buffer (206) (volatile) has a relatively bigger capacity (because of its low cost per memory unit), and is used to buffer a bigger, better version of the sensor data. The vehicle sensor data stored in the first buffer 206 is not compressed, or in an alternative embodiment could be compressed using a lossless compress or a less lossy compression—to preserve data quality.

The second buffer (208) (non-volatile) may have a relatively smaller capacity (because of its high cost per memory unit), and is used to buffer a smaller, lesser quality version of the vehicle sensor data (lossy compression or a more lossy compression) to reduce the size of the data.

Note, the first and second cyclic buffers as referenced herein may also be circular buffers, circular queues, or ring buffers that include a data structure that use a single, fixed-size buffer as if it were connected end-to-end. The buffer structure readily buffers data streams. The reference to cyclic buffers as used herein references how the buffers are used. For example, the cyclic buffers are designed to be full as new data overwrites old data in a cyclic manner, ensuring that the buffer holds the latest set of data. In one embodiment, the first and/or the second cyclic buffers record up to 30 seconds of most recent vehicle sensor data collected. The actual size of the first and/or the second cyclic buffers can vary within the scope of the invention. The actual number of cyclic buffers provided within the improved black box recorder may also vary within the scope of the invention.

In response to an event occurring, such as collision, or near collision, involving the ADV, buffering of the vehicle sensor data is suspended, at least temporarily. Both first cyclic buffer 206 and second cyclic buffer 208 flush their respective contents into NV storage 214. In one embodiment, the event generates a signal to be sent to the cyclic buffers, causing the data to be flushed into the NVM storage.

If the accident is not too disruptive and there is no power interruption to the first cyclic buffer 206, the content of the first cyclic buffer 206 is able to be flushed to the NV storage 217. The data of the first cyclic buffer 206 is preferred as it is of better quality. However, if the accident is more involved and there is a power disruption to the first cyclic buffer 206, the content of 206 may be lost due to the loss of power and unable to be flushed. However, even in the event of a power loss, the compressed data stored in second cyclic buffer 208 (comprising of NVM) would still be retained and accessible via the second cyclic buffer 208 (e.g., in the case of a power interruption) or accessible via the NV storage 214, provide there was no power interruption and the data was flushed.

In one embodiment, the data flushed from the first cyclic buffer 206 is stored in a raw data storage area 216 of the NV storage 214, while compressed and possibly encrypted data flushed from the second cyclic buffer 206 is stored in a compressed data storage area 218 of the NV storage 214. The sensor vehicle data flushed into the NV storage can later be accessed to potentially assist in determining the cause of the event (e.g., analyze the logic failure of the ADV). In one embodiment, controller 134 is in communication with black box recorder and may be activated in response to the event to initiate and complete the data flushing described above.

In one embodiment, the flushing is not necessary. After the accident, the black box can be hooked up with a device, powered on for reading. It may read from the NV storage, force flushing, or read directly from the second cyclic buffer 208, and possible from the first cyclic buffer 206. And in some instances, it may be possible to dissemble the black box, and remove the media and read its contents for accident analysis.

While the raw data would be most useful in analyzing the logic failure of the ADV, if a power failure occurred during the event (e.g., collision), the raw data recorded in the first cyclic buffer 206 (comprising of volatile memory), may be lost and not flushed into the NV storage 214. However, even in the event of a power loss, the compressed data stored in second cyclic buffer 208 (comprising of NVM) would still be retained and accessible via the second cyclic buffer 208 (e.g., in the case of a power interruption) or accessible via the NV storage 214, provide there was no power interruption and the data was flushed.

The event that results in a signal sent to the Black Box via the controller 134, may include a collision or near collision involving the ADV as detected by an inertia sensor, sudden activation of the Braking braking system, failure of the engine or other components within the ADV, such as G-sensors (acceleration) activations, Automatic Emergency Breaking activation, a signal from the Advanced Driver Assistance Systems (ADAS) or autonomous computer that indicates an accident/collision or near collision.

In one embodiment, following the event (e.g., accident/collision or near collision), the recording of the vehicle sensor data is suspended to not overwrite the recorded vehicle sensor data relevant to the event. In another embodiment, the recording of the vehicle sensor data would continue following the event provided the data from the first cyclic buffer 206 was successfully flushed to the NV storage 214.

Figure 3:
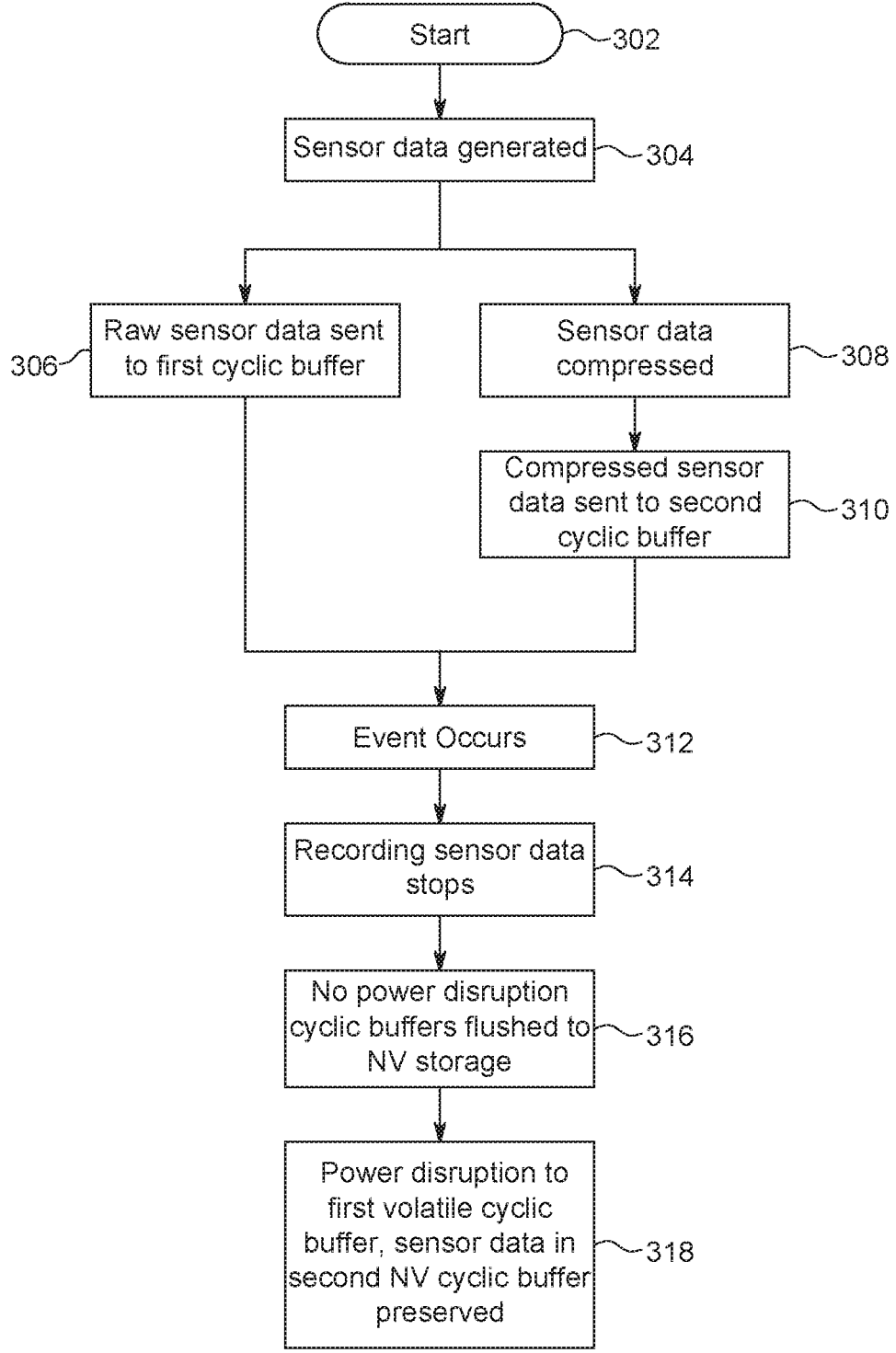
FIG. 3 shows a method to record raw vehicle sensor data and compressed data from an autonomous driving vehicle, according to one embodiment.

FIG. 3 is a flowchart of describing a method of recording data from an autonomous driving vehicle to a black box data recorder, in accordance with one embodiment described herein. The method begins when the autonomous vehicle begins operation 302. The onboard sensors on the autonomous vehicle begin generating data when the vehicle begins operation. These sensors may include GPS data, video or other cameras, radar, lidar, sonar, and laser data, to give just a few examples. This data is generated upon start-up 304. The raw vehicle sensor data is placed into the first cyclic buffer 306. The first cyclic buffer may receive sensor data directly from the sensors.

The first cyclic buffer holds the raw sensor data for a period of time as determined, in one embodiment, by the buffer capacity. As new raw sensor data is received, the oldest raw vehicle sensor data stored in the first cyclic buffer is overwritten with the new raw vehicle sensor data. In one example, the first cyclic buffer has the capacity to store 30 seconds of raw vehicle sensor data. However, other capacity sizes may be used to hold the raw vehicle sensor data within the first cyclic buffer. In one embodiment, the first cyclic buffer is a volatile memory, and if power to the first cyclic buffer is interrupted (e.g., in the case of a collision involving the ADV), the raw vehicle sensor data held in the first cyclic buffer would be lost.

Separate to holding/buffering the raw sensor data in the first cyclic buffer, the vehicle sensor data is also compressed (e.g., lossy compression) 308. In one embodiment, the compressed data may also be encrypted. After the vehicle sensor data has been compressed, the compressed vehicle sensor data is held in a second cyclic buffer 310.

As with the first cyclic buffer, the second cyclic buffer buffers/holds the compressed sensor data for a period of time as determined by the buffer capacity. As new compressed sensor data is received, the oldest compressed sensor data stored in the second cyclic buffer is overwritten with the new compressed sensor data. In one example, the second cyclic buffer has the capacity to store 30 seconds of sensor data. However, other amounts of raw data may be held by second cyclic buffer 208.

In one embodiment, the second cyclic buffer is a non-volatile memory, and if power to the second cyclic buffer is interrupted, the compressed vehicle sensor data held in the second cyclic buffer would not be lost.

At some point during operation, the autonomous vehicle may be involved in an event, such a collision or near collision 312. A near collision could be identified as sudden braking event, a sudden activation of the braking system, or a steering event resulting in a swerving of the vehicle, any of which would trigger a signal from one or more inertia sensors, or other types sensors detecting a measurement above a preset threshold.

Following the occurrence of the event, in one embodiment the recording of the vehicle sensor data is suspended, at least temporarily, to prevent the current data held in the first and second cyclic buffers from being overwritten 314. Provided no power disruption occurred, in response to the event, a signal is sent to the first cyclic buffer and the second cyclic buffer causing the first and second cyclic buffers to flush their contents to the non-volatile storage 316. The raw vehicle sensor data from the first cyclic buffer stored in the non-volatile storage can be accessed to assist in determining the cause of the event. In one embodiment, the vehicle sensor data from the second cyclic buffer may not be flushed to the NV storage.

If the event resulted in a power interruption, the raw vehicle sensor data held in the first cyclic buffer could be lost and not flushed to the non-volatile storage 318. However, even if the event resulted in a power disruption to the second cyclic buffer, which comprises of non-volatile memory, the compressed vehicle sensor data would not be lost and could be accessed post event directly from the second cyclic buffer, or accessed from the NV storage, if the raw vehicle sensor data has been flushed to the non-volatile storage.

In alternative embodiments, the present invention can be implemented on vehicles that are driven by a human operator without autonomous driving support, but still include various vehicle sensors.

An example of non-volatile memory devices as referenced herein, includes a negative-and (NAND) type flash memory. Each of the non-volatile buffers or storage devices can include one or more arrays of memory cells such as single level cells (SLCs) or multi-level cells (MLCs) (e.g., triple level cells (TLCs) or quad-level cells (QLCs)). In some implementations, a particular memory device can include both an SLC portion and a MLC portion of memory cells. Each of the memory cells can store bits of data (e.g., data blocks). Although non-volatile memory devices such as NAND type flash memory are described, the buffers can be based on any other type of memory such as a volatile memory, including but not limited to, random access memory (RAM), read-only memory (ROM), dynamic random access memory (DRAM), synchronous dynamic random access memory (SDRAM), phase change memory (PCM), magneto random access memory (MRAM), negative-or (NOR) flash memory, electrically erasable programmable read-only memory (EEPROM), and a cross-point array of non-volatile memory cells. A cross-point array of non-volatile memory can perform bit storage based on a change of bulk resistance, in conjunction with a stackable cross-gridded data access array. Additionally, in contrast to many Flash-based memory, cross point non-volatile memory can perform a write in-place operation, where a non-volatile memory cell can be programmed without the non-volatile memory cell being previously erased. Furthermore, the memory cells of the buffers, storage devices, and memory devices can be grouped as memory pages or data blocks that can refer to a unit of the memory device used to store data.

The functions and operations as described herein to provide the improved black box recorder for an autonomous driving vehicle can be implemented as a set of instructions to be executed by a data processing system to perform various methods. The instructions could be stored on a non-transitory machine readable medium as software and data which when executed by a data processing system causes the system to perform various methods. The executable software and data may be stored in various places including for example ROM, SSD, Flash memory, volatile RAM, non-volatile memory and/or cache. Portions of this software and/or data may be stored in any one of these storage devices. Further, the data and instructions can be obtained from centralized servers or peer-to-peer networks. Different portions of the data and instructions can be obtained from different centralized servers and/or peer-to-peer networks at different times and in different communication sessions or in a same communication session. The data and instructions can be obtained in entirety prior to the execution of the applications. Alternatively, portions of the data and instructions can be obtained dynamically, just in time, when needed for execution. Thus, it is not required that the data and instructions be on a machine readable medium in entirety at a particular instance of time.

In general, a non-transient machine readable medium includes any mechanism that provides (i.e., stores and/or transmits) information in a form accessible by a machine (e.g., a computer, network device, personal digital assistant, manufacturing tool, any device with a set of one or more processors, etc.).

The functions and operations as described herein can also be implemented using special purpose circuitry, with or without software instructions, such as using Application-Specific Integrated Circuit (ASIC) or Field-Programmable Gate Array (FPGA). Embodiments can be implemented using hardwired circuitry without software instructions, or in combination with software instructions. Thus, the techniques are limited neither to any specific combination of hardware circuitry and software, nor to any particular source for the instructions executed by the data processing system.

The description and drawings are illustrative and are not to be construed as limiting. The present disclosure is illustrative of inventive features to enable a person skilled in the art to make and use the techniques.

Reference to "one embodiment" or "an embodiment" means that a particular feature, structure, or characteristic described in connection with the embodiment is included in at least one embodiment of the disclosure. The appearances of the phrase "in one embodiment" in various places in the specification are not necessarily all referring to the same embodiment, and are not necessarily all referring to separate or alternative embodiments mutually exclusive of other embodiments. Moreover, various features are described which may be exhibited by one embodiment and not by others. Similarly, various requirements are described which may be requirements for one embodiment but not other embodiments. Unless excluded by explicit description and/or apparent incompatibility, any combination of various features described in this description is also included here. For example, the features described above in connection with "in one embodiment" or "in some embodiments" can be all optionally included in one implementation, except where the dependency of certain features on other features, as apparent from the description, may limit the options of excluding selected features from the implementation, and incompatibility of certain features with other features, as apparent from the description, may limit the options of including selected features together in the implementation.

In the foregoing specification, the disclosure has been described with reference to specific exemplary embodiments thereof. It will be evident that various modifications may be made thereto without departing from the broader spirit and scope as set forth in the following claims. The specification and drawings are, accordingly, to be regarded in an illustrative sense rather than a restrictive sense.

What is claimed is:

1. A data recording unit for an autonomous driving vehicle comprising:
   a first cyclic buffer comprising a volatile memory to hold raw vehicle sensor data collected from vehicle sensors, wherein if power to the first cyclic buffer is interrupted the data held in the first cyclic buffer is lost;
   a second cyclic buffer comprising non-volatile memory to hold compressed vehicle sensor data that is a compressed copy of the raw vehicle sensor data received in parallel with the raw vehicle sensor data, wherein if power to the second cyclic buffer is interrupted the data held in the second cyclic buffer is retained; and
   a non-volatile storage coupled to the first cyclic buffer and the second cyclic buffer to store the raw vehicle sensor data and store the compressed vehicle sensor data, wherein in response to an event, the stored data in the first and the second cyclic buffers is moved into the non-volatile storage.

2. The data recording unit of claim 1, wherein in response to the event, any transfer of additional vehicle sensor data to the first and second cyclic buffers is suspended.

3. The data recording unit of claim 1, wherein the event comprises a collision involving the autonomous driving vehicle that includes the data recording unit.

4. The data recording unit of claim 1, wherein following an interruption of power to the data recording unit, the compressed vehicle sensor data is retrievable from at least one of the second cyclic buffer and the non-volatile storage to assist in determining a cause of the event.

5. The data recording unit of claim 1, wherein the event comprises receiving a signal from an inertia sensor and an application of an emergency braking system.

6. The data recording unit of claim 1, wherein the raw and compressed vehicle sensor data comprises data collected from at least one of:
   a camera;
   an infrared camera;
   a sonar;
   a radar; and
   a lidar.

7. A method of recording vehicle sensor data for an autonomous driving vehicle comprising:
   buffering raw vehicle sensor data, collected from vehicle sensors, in a first cyclic buffer comprising a volatile memory, wherein if power to the first cyclic buffer is interrupted the data held in the first cyclic buffer is lost;
   buffering compressed vehicle sensor data that is a compressed copy of the raw vehicle sensor data received in parallel with the raw vehicle sensor data in a second cyclic buffer comprising non-volatile memory, wherein if power to the second cyclic buffer is interrupted the data buffered in the second cyclic buffer is retained; and
   in response to an event, moving data held in the first and second cyclic buffers into a non-volatile storage to store the raw vehicle sensor data and store the compressed vehicle sensor data.

8. The method of claim 7, wherein in response to the event, suspending buffering of additional vehicle sensor data in the first and second cyclic buffers.

9. The method of claim 7, wherein the event comprises a collision involving an autonomous vehicle that includes a data recording unit comprising the first and second cyclic buffers.

10. The method of claim 7, wherein following an interruption of power to the first cyclic buffer, the compressed vehicle sensor data is retrievable from at least one of the second cyclic buffer and the non-volatile storage to assist in determining a cause of the event.

11. The method of claim 7, wherein the event comprises receiving a signal from an inertia sensor and an application of an emergency braking system.

12. The method of claim 7, wherein the raw and compressed vehicle sensor data comprises data collected from at least one of:
   a camera;
   an infrared camera;
   a sonar;
   a radar; and
   a lidar.

13. A non-transitory machine readable medium, having stored thereon a set of instructions, which when executed, perform a method of recording vehicle sensor data for an autonomous driving vehicle, comprising:
   buffering raw vehicle sensor data, collected from vehicle sensors, in a first cyclic buffer comprising a volatile memory, wherein if power to the first cyclic buffer is interrupted the data held in the first cyclic buffer is lost;
   buffering compressed vehicle sensor data that is a compressed copy of the raw vehicle sensor data received in parallel with the raw vehicle sensor data in a second cyclic buffer comprising non-volatile memory, wherein if power to the second cyclic buffer is interrupted the data buffered in the second cyclic buffer is retained; and
   in response to an event, moving data held in the first and second cyclic buffers into a non-volatile storage to store the raw vehicle sensor data and store the compressed vehicle sensor data.

14. The non-transitory machine readable medium of claim 13, wherein the instructions comprise, in response to the event, suspending buffering of additional vehicle sensor data in the first and second cyclic buffers.

15. The non-transitory machine readable medium of claim 13, wherein the event comprises a collision involving the autonomous driving vehicle.

16. The non-transitory machine readable medium of claim 13, wherein following an interruption of power to the first cyclic buffer, the compressed vehicle sensor data is retrievable from at least one of the second cyclic buffer and the non-volatile storage to assist in determining a cause of the event.

17. The non-transitory machine readable medium of claim 13, wherein the event comprises receiving a signal from an inertia sensor and an application of an emergency braking system.

* * * * *